United States Patent [19]

Yamamoto et al.

[11] Patent Number: 4,683,433
[45] Date of Patent: Jul. 28, 1987

[54] IMAGING METHOD AND APPARATUS USING NUCLEAR MAGNETIC RESONANCE

[75] Inventors: Etsuji Yamamoto, Hachioji; Hideki Kohno, Suginami; Masao Kuroda, Nakano; Shigeru Matsui, Koganei; Hidemi Shiono, Akigawa, all of Japan

[73] Assignee: Hitachi, Ltd., Tokyo, Japan

[21] Appl. No.: 636,995

[22] Filed: Aug. 2, 1984

[30] Foreign Application Priority Data

Aug. 15, 1983 [JP] Japan ................................. 58-148081

[51] Int. Cl.$^4$ ............................................. G01R 33/20
[52] U.S. Cl. ..................................... 324/309; 324/307
[58] Field of Search ............... 324/300, 307, 309, 313, 324/318, 322, 311

[56] References Cited

U.S. PATENT DOCUMENTS 4,471,306  9/1984  Edelstein et al. ..................... 324/309
4,520,828  6/1985  Burl et al. ........................ 324/309 X
4,536,712  8/1985  Iwaoka et al. ....................... 324/307
4,587,488  5/1986  Young ............................. 324/309 X

FOREIGN PATENT DOCUMENTS 2148013  4/1985  United Kingdom ................ 324/300

Primary Examiner—Stewart J. Levy
Assistant Examiner—Scott M. Oldham
Attorney, Agent, or Firm—Antonelli, Terry & Wands

[57] ABSTRACT

An NMR imaging apparatus and method for detecting a nuclear spin resonance signal from an object, which is placed in a magnetic field, to produce images of the object. At an instant when the spins come into phase after the signal detection by a first spin excitation, RF magnetic field pulses are applied for rotating the direction of the spin to that opposite to the initial state. After that, the spin excitation and the signal direction of second time are conducted to measure the data which are different in the effect of the relaxation time from the first measurements. By repeating these sequences, it is possible to produce a plurality of images such as an intensity image or a relaxation time enhanced image.

8 Claims, 30 Drawing Figures

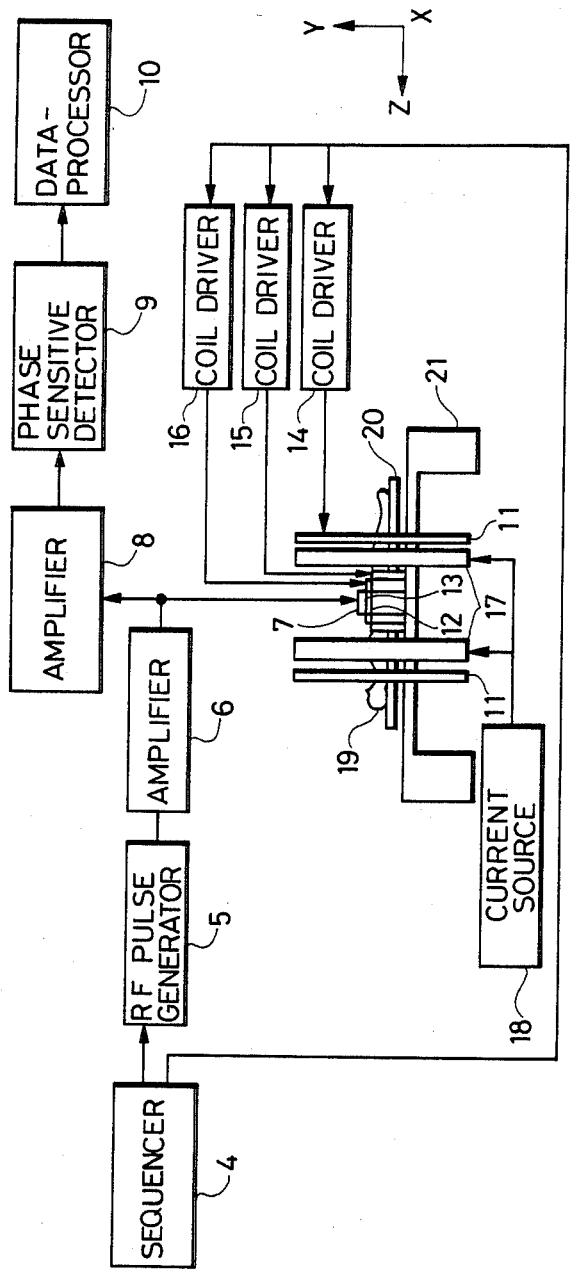
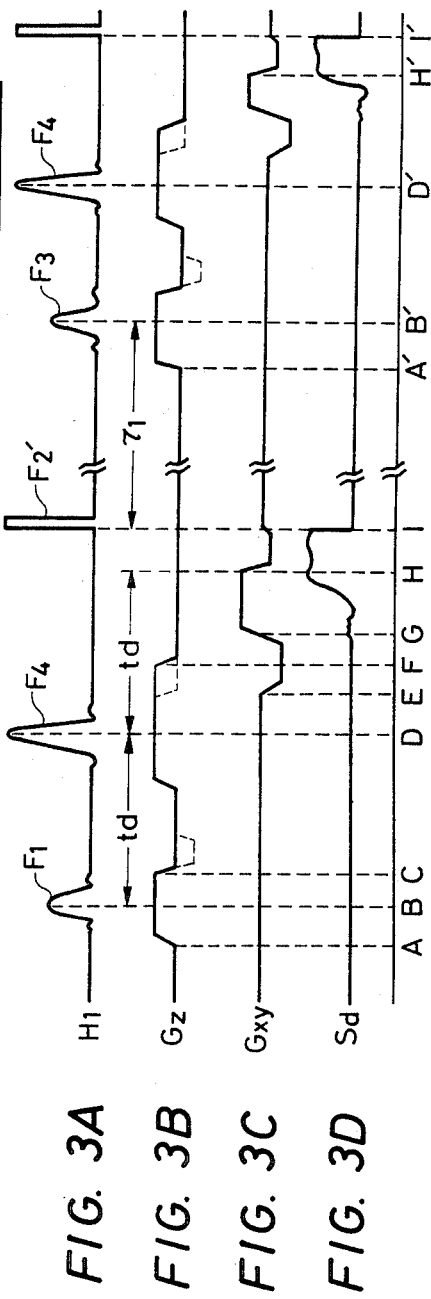
FIG. 1
FIG. 3A
FIG. 3B
FIG. 3C
FIG. 3D

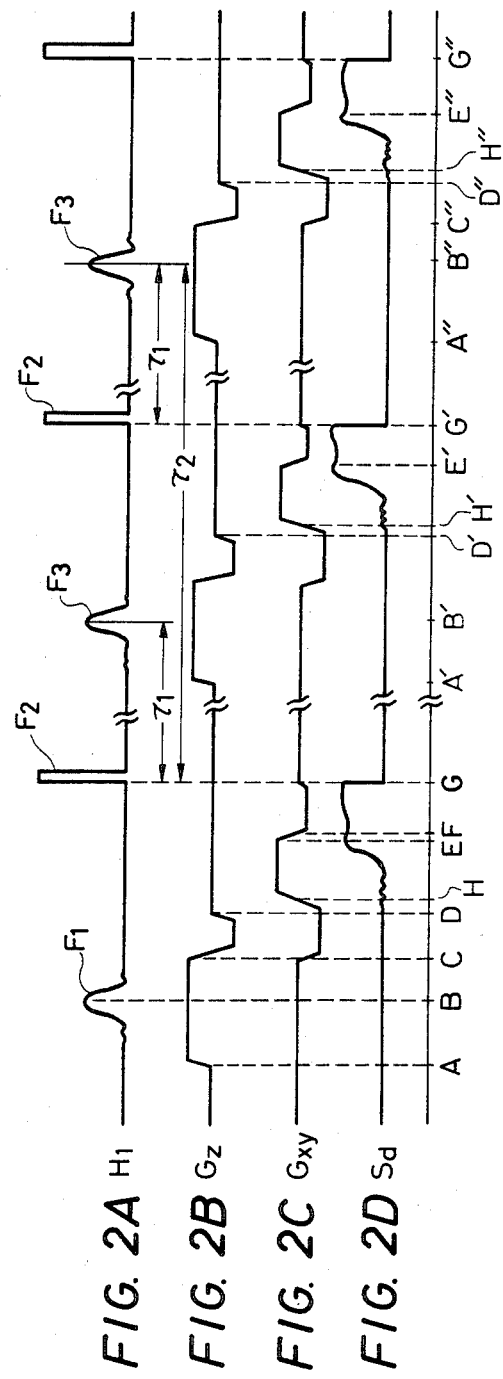

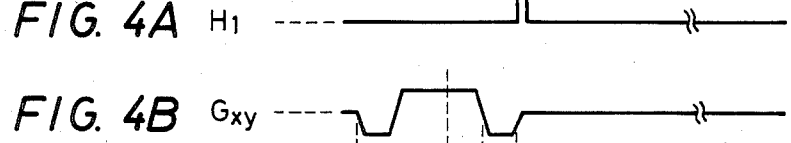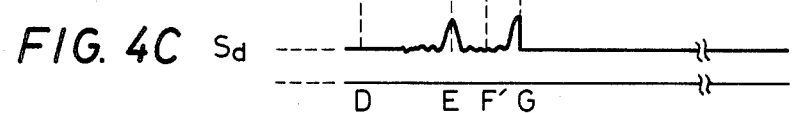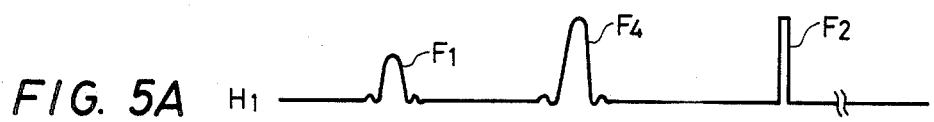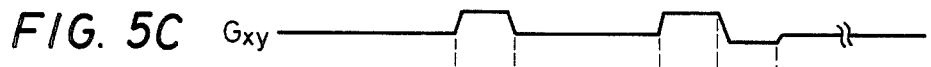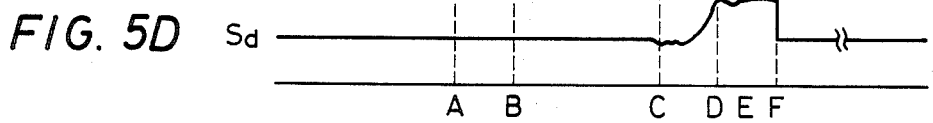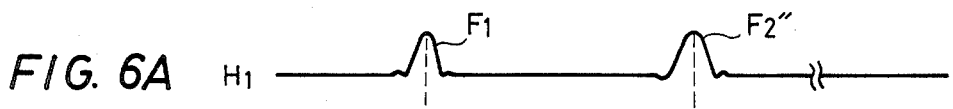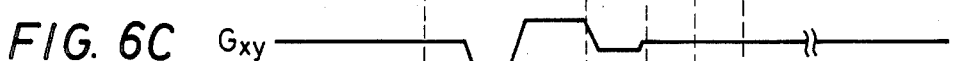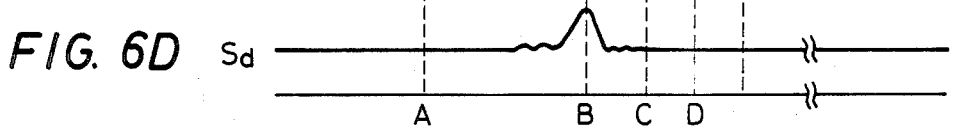

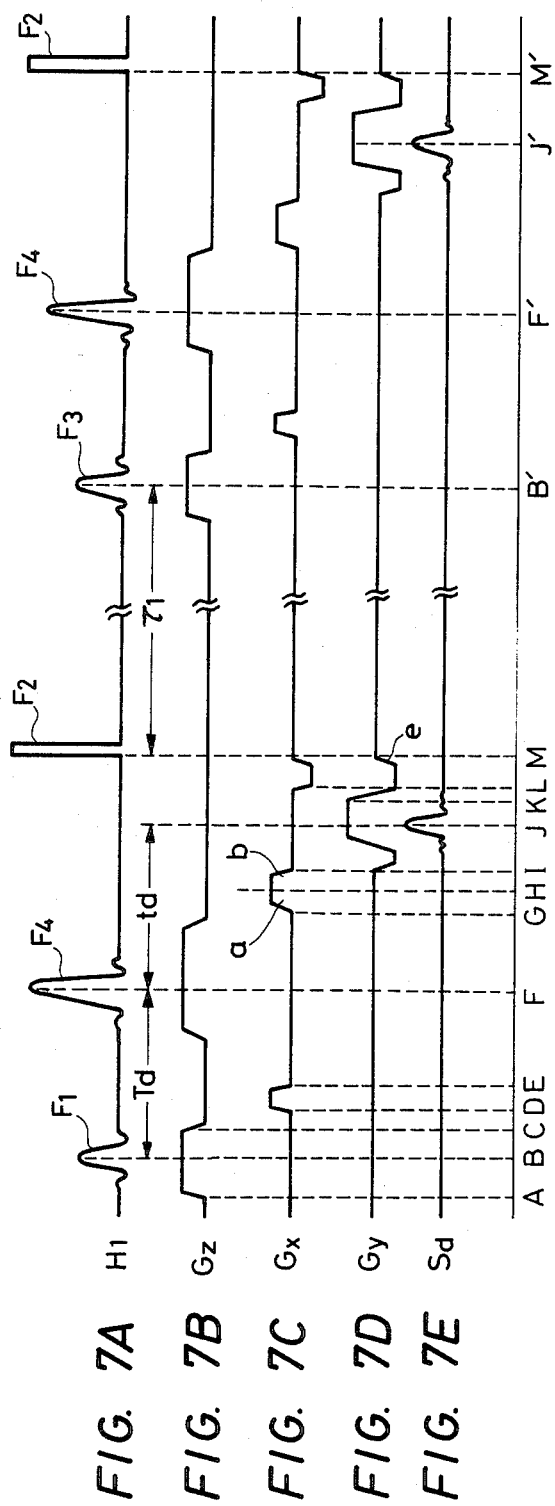

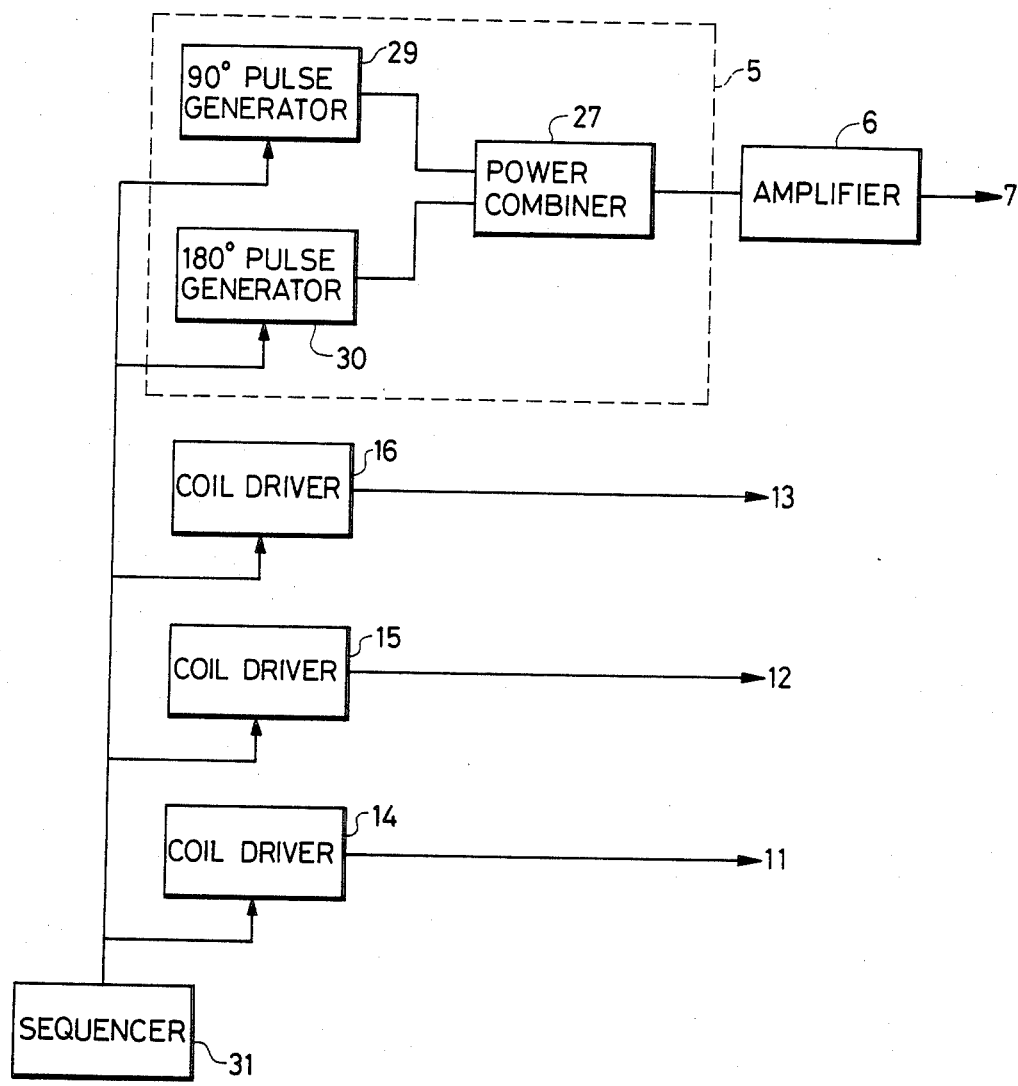

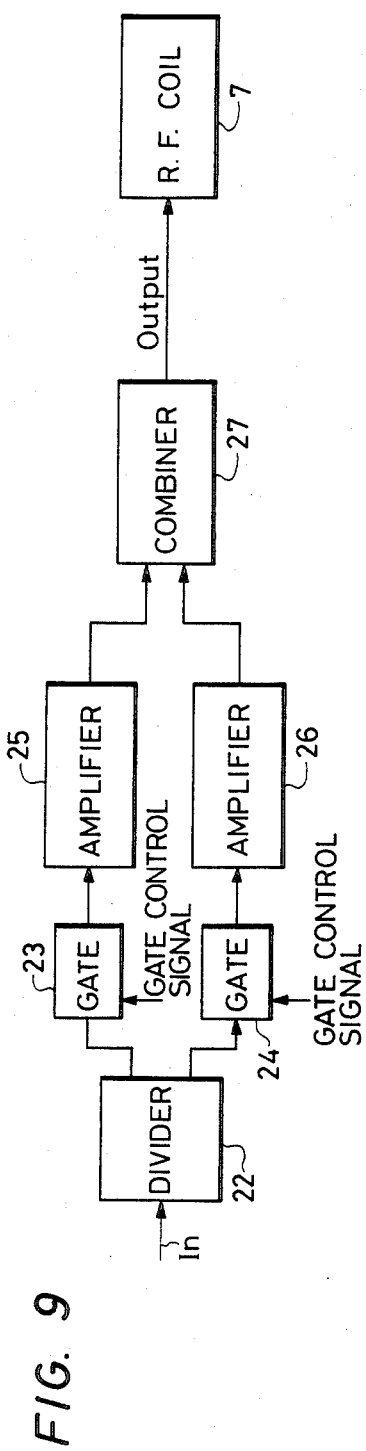
FIG. 9
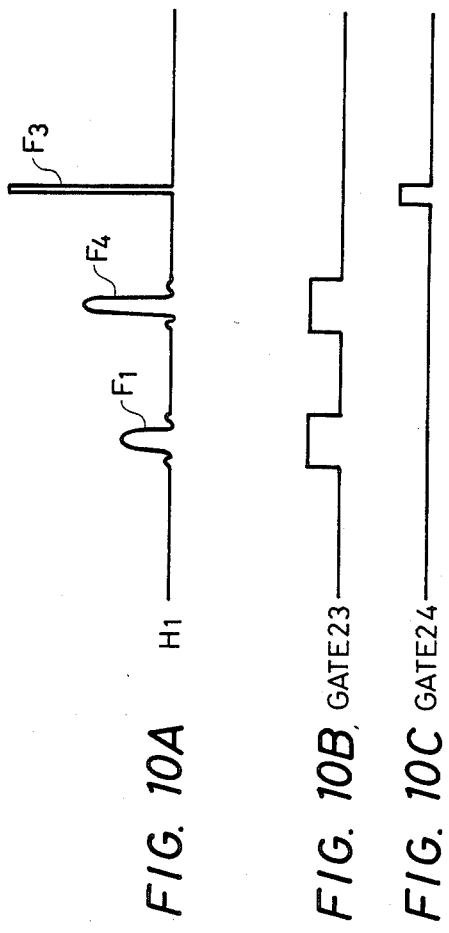
FIG. 10A  $H_1$
FIG. 10B  GATE23
FIG. 10C  GATE24

IMAGING METHOD AND APPARATUS USING NUCLEAR MAGNETIC RESONANCE

BACKGROUND OF THE INVENTION

The present invention relates to an imaging method using nuclear magnetic resonance (which will be shortly referred to as "NMR") and, more particularly, to an imaging apparatus for imaging a nuclear density distribution or a relaxation time distribution by measuring the nuclear magnetic resonance signal of hydrogen or phosphor in an organism and an imaging method therefor.

In the prior art, an X-ray CT or an ultrasonic imaging apparatus is widely used as an apparatus for imaging in vivo the internal structure such as the head or abdomen of a human body. In recent years, it has been revealed that the trial to make similar images by using the nuclear magnetic resonance phenomenon has succeeded so that the data which cannot be attained by the X-ray CT or the ultrasonic imaging apparatus can be achieved. In the imaging apparatus using the nuclear magnetic resonance, it is necessary to separate and discriminate the signal from an object to be imaged in a manner to correspond to the individual portions of the object. There is one method for obtaining positional data of an object to be detected by applying a gradient field to the object to make different the static fields, in which the portions of the object are placed, thereby to make different the resonance frequencies of the individual portions. For example, in an imaging method called the "projection-reconstruction method", which is disclosed by C-M La and P. C. Lauterber, Journal of Physics (E) Scientific Instrument Vol. 13, 1980, pp 747–750, the direction of the gradient field is turned step by step, and the projection data of the resonance signals, which are obtained as functions of the intensities of the magnetic field for the respective angles of turns so that the images indicating the nuclear spin distribution of the object may be obtained.

As is disclosed by J. M. S. Hutchison, et al., Journal of Physics (E) Scientific Instrument Vol. 13, 1980 pp 947–955, the difference in longitudinal relaxation time at the individual portions of the object appears in a superposed manner on the spin intensity distribution if RF magnetic pulses for rotating the nuclear spin 180 degrees are applied prior to the measurement of the individual projection data and if the nuclear spin is excited again after a predetermined time has elapsed. This image will be called a "relaxation time enhanced image" in the following.

The distribution of the relaxation time may frequently become more important data than the distribution of the spin intensity. However, the absolute value of the relaxation time cannot be known from a single relaxation time enhanced image but can be determined either from both an intensity image indicating the intensity distribution of the nuclear spin and the relaxation time enhanced image or from a plurality of relaxation time enhanced images having different relaxation time effects. Despite of this fact, the imaging apparatus of the prior art has measured the intensity images and the relaxation time images, or the plural relaxation time enhanced images of different relaxation time effects independently of one another. As a result, the measurement time for obtaining those plural images has been the summation of the measurement times for obtaining the individual images.

SUMMARY OF THE INVENTION

An object of the present invention is to provide an NMR imaging method and apparatus which can produce for a short time a plurality of images having different relaxation time effects, i.e., an intensity image and a relaxation time enhanced image, or a plurality of relaxation time enhanced iamges.

The NMR imaging apparatus according to a feature of the present invention executes repeatedly a series of sequences, in which, after a first signal detecting step including excitation of the nuclear spin of an object to be imaged and detection of a resonance signal generated as a result of the excitation, a 90-degree RF magnetic field for rotating the direction of the nuclear spin oppositely of the initial state at the instant when the nuclear spins come into phase, and in which a second signal detecting step including again excitation of the nuclear spin and detection of a resonance signal generated as a result of the excitation is effected after that application.

By varying the standby time until the excitation of the nuclear spin at said first signal detecting step and said second signal detecting step, there are obtained resonance signal data which have different effects of the relaxation time.

In the imaging apparatus using the projection-reconstruction method, it is the data of the object projected at a predetermined angle that are obtained by the above series sequences, and the imaging operations by the series sequences are repeated by varying the angles. According to the present invention, the plural projection data of different relaxation time effects are obtained during the series sequences so that the number of repetitions of the imaging sequences is reduced, as compared with the prior art, to produce the plural images of different relaxation time effects for a substantially equal time.

Incidentally, in a typical example, the imaging operation for the spin intensity image is conducted at the first signal detecting step, and the imaging operation for a longitudinal relaxation time enhanced image is conducted at the second signal detecting step. However, the present invention should not be limited to the above but can be applied to an apparatus for producing a plurality of various images having different effects of a longitudinal relaxation time $T_1$ and a transverse relaxation time $T_2$.

There have been proposed a variety of methods of directly imaging Fourier-transformed orthogonal coordinate points of the nuclear spin distribution or the relaxation time distribution in an object to be imaged, as is different from the projection-reconstruction method. In the apparatus using this direct Fourier imaging method, too, a plurality of imaging operations by repeating the predetermined pulse sequences are required for obtaining completed image data. By applying the present invention, the plural data of different relaxation time effects can be imaged during a series of pulse sequences repeated plural times so that the plural images such as the intensity images or the relaxation time enhanced images can be produced for a period substantially equal to that for producing a single image.

Moreover, the direct Fourier imaging method or the projection-reconstruction method will produce a three-dimensional image if it is used of itself. Despite of this, most of the actual apparatus image a predetermined slice face of the object by the method called the "selective excitation method". The specific explanation of the present invention to be made hereinafter is concerned with the latter example, but the present invention can be applied to the former example.

BRIEF DESCRIPTION OF THE DRAWINGS

FIG. 1 is a diagram showing the construction of one embodiment of the apparatus to be used in the present invention;

FIGS. 2A-D, 3A-D, 4A-C, 5A-D, 6A-D, and 7A-E are charts for explaining the embodiments of the pulse sequences to be used in the present invention;

FIG. 8 is a block diagram showing the construction of one embodiment of the present invention for the pulse sequences;

FIG. 9 is a diagram showing an example of the construction which uses two kinds of amplifiers having different efficiencies; and FIG. 10A-C is a time chart showing the operations of FIG. 9.

DESCRIPTION OF THE PREFERRED EMBODIMENTS

The present invention will be described in the following in connection with the embodiments thereof with reference to the accompanying drawings. FIG. 1 shows the construction of the imaging apparatus according to one embodiment of the present invention. A sequencer 4 outputs a variety of instructions at a predetermined timing to individual units. An RF-pulse generator 5 has its output amplified by an amplifier 6 to excite an RF coil 7. This RF coil 7 also acts as a receiving coil so that the signal component received is detected through an amplifier 8 by a phase sensitive detector 9 until it is transduced to an image by the action of a data processor 10. The output of the RF pulse generator 5 is used as a reference signal when a quadrature detection is conducted by the phase sensitive detector 9. The gradient fields in the direction Z and in the perpendicular directions are generated by gradient coils 11, 12 and 13, respectively, which are driven by coil drivers 14, 15 and 16, respectively. The static field is generated by coils 17 which are driven by a current source 18. The gradient coil 13 has the same shape as that of the gradient coil 12 and a relation to the gradient coil 12 such that they are rotated at 90 degrees on the Z axis with respect to each other so that they generate the gradient fields perpendicular to each other. A human body, i.e., an object to be imaged is placed on a bed 20 which is carried on a carriage 21.

FIGS. 2A to 2D show examples of the pulse sequences of the present embodiment. These examples are prepared by the projection-reconstruction method, and a similar method can also be applied to the Fourier zeugmatography, the spin warp imaging method and so on.

FIG. 2A shows the RF pulses $H_1$ which are generated by the RF coil 7. Incidentally, it is only one side of the envelope that is shown. FIG. 2B shows the gradient field pulses $G_z$ in the direction of the Z axis, which are generated by the gradient coil 11. FIG. 2C shows the gradient field pulses $G_{xy}$ which are generated perpendicularly to the pulses $G_z$ by the gradient coils 12 and 13. FIG. 2D shows one side of the envelope of the echo signal which is observed by the RF coil 7. Here, the gate disposed in the receiving system is turned off during the period except the periods D-G, D'-G' and D"-G" so that the signal is not used as the data.

In the projection-reconstruction method, the gradient field $G_{xy}$ is rotated step by step so that the projected data of the nuclear spin are obtained at each step. FIG. 2 shows only a series of pulse sequences for obtaining projection data of a certain angle. In order to obtain a completed image, the sequences of FIG. 2 are repeated while the direction of the pulses $G_{xy}$ are rotated. First of all, at an instant A, the gradient field $G_z$ is applied. Substantially simultaneously with this, a 90-degree RF pulse magnetic field $F_1$, which is the instant B as the center, is excited to rotate only the magnetization in a predetermined slice by 90 degrees. This 90-degree RF magnetic field has such a waveform, for example, as is modulated into a Gaussian type so that its band is restricted. The RF pulse magnetic field to be used with the application of that gradient field is called the "selective excitation pulses". The phase dispersion having occurred during the excitation of the 90-degree RF pulse magnetic field can be corrected by inverting the magnetic field $G_z$ at an instant C. More specifically, the waveform of the magnetic field $G_z$ is so set by the amplitude and application period of the current to be fed to the coil 11 as to satisfy the following equation:

$$\int_B^C G_z dt + \int_C^D G_z dt = 0. \quad (1)$$

At an instant C, moreover, such a gradient field $G_{xy}$ is applied as has its direction changed on the xy-plane for each projection and its direction inverted at an intermediate instant H. At this time, the signal takes its peak at an instant E satisfying the following equation:

$$\int_C^H G_{xy} dt + \int_H^E G_{xy} dt = 0 \quad (2)$$

If the gradient field $G_{xy}$ is promptly cut at the instant E, the nuclear spins thereafter can be brought into phase. In fact, however, the gradient field $G_{xy}$ drops with a predetermined time constant. After an instant F, therefore, the direction of the gradient field $G_{xy}$ is inverted. More specifically, the gradient field $G_{xy}$ is applied in a direction to delete the integrated value of the fall portion of the field $G_{xy}$. The magnitude of this field $G_{xy}$ can be arbitrarily selected. As a result, the signal can be measured without being affected by the fall of the gradient field, and the magnetizations after the measurements can be brought into phase.

In this case, the following equation holds:

$$\int_C^G G_{xy} dt = 0. \quad (3)$$

The signal is taken in during the period DE because meaningful data are contained during that period. However, the signal during the period EG is not used for the image reconstruction because it is affected by the transient phenomena of the gradient field. The signal to be observed during the period DE contains data mainly concerning the intensity.

Now, the magnetization at the instant G is located in the xy-plane and is in phase so that a 90-degree RF pulse magnetic field $F_2$ having no band restriction is excited.

These magnetic pulses are called the "non-selective excitation pulses". The magnetization in a predetermined slice face is oriented in the opposite direction to that of the first magnetization because the 90-degree pulses are excited twice. The reason why the 90-degree pulses are made the non-selective excitation pulses is intended to make the period for application of the RF pulses as short as possible thereby to reduce the phase dispersion in the excitation period.

When a period $\tau_1$ elapses after excitation of the 90-degree non-selective excitation pulse magnetic field $F_2$, a $-90$-degree selective excitation pulse magnetic field $F_3$ is excited to turn the magnetization on the xy-plane. Then, the signal is measured like before during the period D'E'. The application sequences of the gradient fields from an instant A' to an instant G' are absolutely the same as the application sequences from the instant A to the instant G, as has been described hereinbefore. Only the difference from the period AG resides in that the selective excitation pulses $F_3$ are out of phase of 180 degrees from the pulses $F_2$ so that they are $-90$-degree pulses. During this period D'E', the projection data, on which the effects of the longitudinal relaxation time $T_1$ of the individual portions of the object are overlapped, are detected. If the magnetization of the object portion inverted at the instant G is designated at M(0), the magnetization of each portion after lapse of the period $\tau$ is expressed by the following equation if the longitudinal relaxation time of that portion is designated at $T_1$:

$$M(\tau) = M(0)\{1 - 2e^{-\tau T_1}\} \qquad (4)$$

As a result, the signal observed during the period D'E' contains the data of magnetization of each portion for $\tau = \tau_1$ in the equation (4), i.e., the data of the spin intensity distribution on which the distribution of the longitudinal relaxation time $T_1$ is overlapped. The time $\tau_1$ can be arbitrarily selected in accordance with the enhancing effect of the period $T_1$, normally, at 0.1 to 0.5 seconds, which range may be overpassed. The individual pulses for the period G'—G" are repetitions of the operations for the period G—G' so that the signals for various times $\tau$ can be measured by those repetitions. For the period D"E", specifically, the data of the $T_1$ enhanced image for $\tau = \tau_2 = 2\tau_1$ are observed. By making repetitions of three times for $\tau_1 = 0.1$ seconds, for example, the signals corresponding to 0.1, 0.2 and 0.3 seconds as the time $\tau$ in the equation (4) are obtained. The period G—G' is usually 5 to 20 mseconds so that the measurement is ended for about 0.3 seconds so as to obtain four kinds of signals. The sequence of observing the projection data by a series of pulse applications is repeated while the direction of the pulses $G_{xy}$ are rotated step by step. And, the projection data for the period DE at each angle are reconstructed to produce the spin intensity image of the object. Moreover, the projection data for the period D'E' or D"E" are reconstructed to produce a longitudinal relaxation time enhanced image. In case, however, transfer is made to a subsequent projection angle after the projection data of a certain angle are observed, a standby has to be made for 0.5 to 1 second like the prior art method. Since it takes at least 0.5 to 1 second according to the method of the prior art to obtain the signal of one kind, the total standby time for obtaining the signals of four kinds is 2 to 4 seconds. According to the present embodiment, the time period for the measurement is shortened several times, as compared with the prior art method.

Incidentally, the reason why the 90-degree selective excitation pulses $F_3$ to be excited for the period GG' are out of phase by 180 degrees from the 90-degree pulses $F_1$ for the period AG is to make such signals of the same polarity as are generated by the respective pulse excitations. However, the phase of the pulse $F_3$ may be the same as that of the pulse $F_1$. In this case, the signal observed in period D'E' should be inverted at the signal processing step.

A second embodiment of the present invention is shown in FIGS. 3A to 3D. Specifically: FIG. 3A shows RF pulses; FIG. 3B shows the gradient field pulses $G_z$ in the z-direction; FIG. 3C shows the gradient field pulses $G_{xy}$ in the x- and y-directions; and FIG. 3D shows an echo signal $S_d$.

In this embodiment, not the inversion of the gradient field $G_z$ but the 180-degree selective excitation pulse magnetic field $F_4$ is used for forming the echo signal. It is at an instant H, when a time $t_d$ equal to a time $t_d$ for the period BD elapses from the instant D, that the peak of the echo is formed. According to this method, the phase dispersion due to the unevenness of the static field can be corrected. The conditions for eliminating the phase dispersion by the pulses $G_z$ and $G_{xy}$ at the instant H and for forming the peak of the echo are given by the following equation:

$$\int_B^F G_z dt = \int_E^H G_{xy} dt = 0.$$

In order to be freed from the fall of the pulses $G_{xy}$ and to bring the pulses into phase at the instant I, on the other hand, the following equation has to hold:

$$\int_E^I G_{xy} dt = 0$$

This condition is absolutely the same as the period CG in FIGS. 2A to 2D. In the sequence thus far described, the projection data of the spin intensity of the object are observed during the period GH. Next, since the nuclear spins are in phase at the instant I, $-90$-degree non-selective excitation pulses $F_2'$ are applied so that it may invert the magnetization together with the pulses $F_1$ and $F_4$ which have been applied before. At this instant, the same state comes as that in which the 90-degree nonselective excitation pulses $F_2$ were applied at the instant G of FIG. 2. After that, in order to obtain the projection data on which the effects of the relaxation time are overlapped, the sequences similar to those shown for the period A-I of FIGS. 3A to 3D are repeated for the period A'-I'. Despite of this fact, the period A'-I' is different from the period A-I in that a standby has to be made for the time $\tau_1$ until the application of the pulses $F_2$ and in that the pulses $F_3$ are the $-90$-degree selective excitation pulses. On and after the instant I', in order to obtain the data of another relaxation time enhanced image, the pulses for the period I—I' may be repeated again like FIG. 2.

By the sequences of FIGS. 3A to 3D, too, as has been described hereinbefore, a plurality of projection data having different relaxation time effects can be obtained for the series sequences so that a plurality of images can be obtained for a short period by repeating the observations of the projection data to respectively reconstruct them while rotating the pulses $G_{xy}$. As shown by broken lines in FIG. 3B, incidentally, it is also effective to invert and apply the gradient field $G_z$ for the time period matching the application of the magnetic field $G_z$ after the center of the 90-degree selective excitation pulses $F_1$ and to advance the instant F when the magnetic field $G_z$ is dropped after application of the 180-degree selective excitation pulses $F_4$.

FIGS. 4A to 4C show a modified example of the pulse sequences of FIGS. 2A to 2D. In this modified example, the pulses $H_1$ and $G_z$ are common with those of the example of FIG. 2, but the pulses $G_{xy}$ shown in FIG. 4B have a different shape. Specifically, the pulses $G_{xy}$ are inverted not at the instant E, when the signal $S_d$ shown in FIG. 4C takes its peak, but at the instant F' when the signal $S_d$ is attenuated again. As a result, the signals at both the sides of the peak can be used. In this case, too, the following condition is imposed to apply the 90-degree non-selective excitation pulses at the instant G when the phase dispersion is corrected:

$$\int_D^G G_{xy} dt = 0.$$

This modification can also be made to the embodiment shown in FIG. 3.

Since, in the examples thus far described, the non-selective excitation pulse magnetic field $F_2$ is used to rotate the magnetization by 90 degrees, the magnetization other than the predetermined slice face is also rotated by 90 degrees. As a result, this magnetization may possibly cause noises at the subsequent measurement. In fact, however, the magnetization other than the longitudinal one is attenuated by the pulses $G_z$ to be applied next so that the attenuation is effected to a sufficiently negligible value.

Moreover, a third embodiment is shown in FIGS. 5A to 5D. In the present embodiment, the pulses $G_{xy}$ are applied for the period AB before the 180-degree selective excitation pulse magnetic field $F_4$ but are not inverted midway, as in the example shown in FIGS. 3A to 3D. The signal takes its peak just at the instant D when the following equation is satisfied:

$$\int_A^B G_{xy} dt = \int_C^D G_{xy} dt$$

As the method of inverting the pulses $G_{xy}$ to eliminate the influences of the fall after the peak of the signal, not only the method shown in FIGS. 2 and 3 but also the method shown in FIG. 4 can be used together, as in the embodiment of FIG. 3.

A fourth embodiment of the present invention is shown in FIGS. 6A to 6D. Here, the selective excitation pulse magnetic field is used for the 90-degree pulses $F_2''$ after the end of observation for obtaining the intensity image so that measurement can be made without giving any disturbance to the region other than the object slice. In this example, as has been described hereinbefore, the condition for bringing the echos into phase at the instant B thereby to cause the peak is given by the following equation:

$$\int_A^B G_z dt = \int_A^B G_{xy} dt = 0.$$

After the appearance of the peak of that signal, the pulses $G_{xy}$ are inverted so as to eliminate the influences of the fall. Then, the peak of the signal appears again at the instant C where the following condition is satisfied:

$$\int_B^C G_{xy} dt = 0$$

If the 90-degree selective excitation pulse magnetic field is applied at the instant when the signals are in phase, the magnetization in the slice is rotated by 90 degrees until it is oriented in the direction of $-Z$. The reason why the gradient field pulses $G_z$ in the $-Z$ direction are applied at the instant B is to remove the phase dispersion which is caused during the excitation of the selective excitation pulses $F_2''$, and the gradient field pulses are applied in a manner to substantially satisfy the following equation:

$$\int_B^D G_z dt = 0.$$

Thus, by repeating the period AD after the standby time of $\tau_1$ after the magnetization is inverted in the direction of just 180 degrees from the first, it is possible to obtain signals for a variety of longitudinal relaxation times. In the method shown in FIGS. 6A to 6D, the phase dispersion generated as a result of unevenness of the static field like the example shown in FIGS. 2A to 2D is not corrected, but the error may be accumulated each time the sequence of the period AD is repeated. As shown in FIGS. 3A to 3D, on the contrary, the 180-degree pulses may be excited midway to correct the phase dispersion resulting from the unevenness of the static field. Incidentally, the signals can be brought into phase by using not only the sequences shown in FIGS. 6A to 6D but also the sequences shown in the embodiments thus far described so that the pulses $G_z$ shown in FIG. 6B and the 90-degree selective excitation pulses $F_2''$ shown in FIG. 6A can be applied at that instant. On the other hand, the description thus far described is directed to the intensity image and the longitudinal relaxation time enhanced image. By changing the time $t_d$ shown in FIG. 3B, however, the transverse relaxation time enhanced image can also be produced. In this case, it is necessary to measure the transverse relaxation time enhanced image after the intensity image has been measured.

The pulse sequences according to the fifth embodiment of the present invention are shown in FIGS. 7A to 7E. FIG. 7A shows RF magnetic field pulses $H_1$; FIG. 7B shows gradient field pulses $G_z$ in the z direction; FIG. 7C shows gradient field pulses $G_x$ in the x direction; FIG. 7D shows gradient field pulses $G_y$ in the y-direction; and FIG. 7E shows an echo signal.

These sequences are used in case the images are to be constructed by the Fourier zeugmatography. In the projection-reconstruction method shown in FIGS. 2 to 6, gradient fields $G_x$ and $G_y$ are applied at the same time. In the present sequences, however, positional data are given two-dimensionally to the object by giving the phase in the x-direction with the pulses $G_x$ and then by giving the phase in the y-direction with the pulses $G_y$ so that the original object may be reproduced by the Fourier transformation of the signals obtained.

First of all, at the instant B, the 90-degree selective excitation pulses $F_1$ are applied with the application of the pulses $G_z$ to excite the magnetization of a predetermined slice face. After lapse of the time $T_d$ from that instant, the 180-degree selective excitation pulses are applied so that the spin echo may be generated in the signal $S_d$ at an instant J after lapse of a time $t_d$. Here, the signal $S_d$ has its phase encoded in accordance with the amplitude of the pulses $G_x$ applied for the period GI. More specifically, the integrated value of the remaining portion b, which is the remainder of the subtraction of the portion matching the pulses applied in advance for the period DE before the 180-degree selective excitation pulses $F_4$ are applied, provides the magnitude of the phase encoding. In order to give the data in the y-direction, on the other hand, the y-direction gradient field $G_y$, which is inverted midway from the instant I, is applied. At the instant J when the spin echo reaches its peak, the following equation holds:

$$\int_I^J G_y dt = 0.$$

The signal around the instant J provides the data containing the spin intensity distribution. At an instant K after observation of the data, the pulses $G_y$ are inverted. At an instant L, moreover, the pulses $G_x$ in the opposite direction for matching the portion b are applied so that the direction of the magnetization may be aligned at an instant M. The conditions for this alignment are to satisfy the following two equations:

$$\int_H^M G_x dt = 0; \text{ and } \int_I^M G_y dt = 0.$$

Thus, at the instant M when the magnetizations in the predetermined slice face are aligned, the −90-degree non-selective excitation pulses $F_2$ are applied. Thus, by summing up the selective excitation pulses $F_1$ and $F_2$ applied in advance, the magnetization in the predetermined slice face is resultantly rotated by 180 degrees from the initial state to the −z direction. After the instant M, the sequences described above are repeated to obtain the data on which the effects of the longitudinal relaxation time are overlapped. Despite of this fact, the pulses $F_3$ are applied at an instant B, after lapse of the time $\tau_1$ from the instant M so as to effect the longitudinal relaxation time. Incidentally, the pulses $F_3$ are different from the pulses $F_1$ in that they are the −90-degree selective excitation pulses. The signal $S_d$ observed around the instant J' contains the data of the intensity distribution on which the effects of the longitudinal relaxation time after lapse of the time 96 $_1$ are overlapped. By repeating the sequences for the period M—M', it is possible to obtain other data on which the effects after lapse of the time of $2\tau_1$.

The series pulse sequences thus far described are repeatedly executed several times by varying the amplitude of the phase encoding pulses $G_x$ step by step. The data observed around the instants J and J' are accumulated and are subjected to two-dimensional Fourier inverse transformation so that the intensity images and the $T_1$ enhanced images are produced.

The present invention can also be applied to the case in which the direct Fourier imaging method is used as above. Despite of this fact, the present invention should not be limited to FIGS. 7A to 7E, but the spin echo can be formed by the use of inversion of the pulses $G_x$ in place of the 180-degree selective excitation pulses, as in the example shown in FIGS. 2A to 2D. At the instant J (or J') of the peak of the spin echo, moreover, the pulses $G_y$ are inverted, and the observation of the data may be limited to before the instant J (or J'). Like the example shown in FIG. 6, still moreover, all the RF magnetic field pulses can be selective excitation pulses.

As shown in FIGS. 3, 5, and 7, the 180-degree selective excitation pulses are used to form the spin echo. It should be also understood that such spin echo may be formed by the application of the 180-degree non-selective excitation pulses with no application of the pulses $G_z$. Further it should be noted that the pulses to rotate the magnetization for −90 degrees may be the non-selective excitation pulses (with no application of the pulses $G_z$) other than the non-selective excitation pulses.

FIG. 8 is a block diagram for realizing the individual embodiments thus far described.

In the Figure, reference numerals 29 and 30 indicate a 90-degree pulse generator and a 180-degree pulse generator, both of which are connected with a power combiner 27. These pulse generators 29 and 30 and power combiner 27 construct together the pulse generator 5 of FIG. 1. Moreover, all the X-, Y- and Z-gradient field generators and the 90- and 180-degree pulse generators are controlled by a sequencer 31. This sequencer 31 forms a part of the sequencer 4 of FIG. 1 and is constructed such that it can generate the timing signal for the sequences of the foregoing individual examples thereby to control the signals of the individual pulse generators. This operation can be achieved, as a specific example, by storing the sequence in an ROM. In FIG. 8, incidentally, the same numerals indicate portions identical to those of FIG. 1.

In the description thus far made, both the waveform and square form, to which the amplitudes are modulated by the Gaussian or Sinc Function, are used as the pulses for generating the RF magnetic fields. The latter has to have a large amplitude so as to shorten the excitation period and is accordingly formed into the square shape which can be easily modulated.

As a result, it becomes remarkably inefficient to generate the waveforms of the two by the single amplifier. For the former, more specifically, the amplifiers which are featured by not efficiency but linear relationship, such as A-class or AB-class amplifiers having a linear relationship in its input/output characteristics are suitable. For the latter, on the other hand, a C-class or amplifier having an excellent efficiency or an AB-class amplifier of less idling current in its operation is suitable because the latter may use square waves.

Incidentally, the AB-class amplifier can be used for the former or latter becuase it can change its efficiency by changing the idling current. Therefore, the apparatus making use of two kinds of amplifiers having different efficiencies and used in the amplifier of FIG. 1 is shown in FIG. 9. An RF input In is divided by the action of a divider 22 into two halves, which are inputted through gates 23 and 24 to amplifiers 25 and 26. The operations of the gates are shown in FIGS. 10A to 10C. As shown in FIG. 10A, more specifically, for the 90-degree selective excitation pulse magnetic field $F_1$ and the 180-degree selective excitation pulse magnetic field $F_4$, the gate 23 shown in FIG. 10B is turned on so that the input is applied to the amplifier 25. For the −90- degree non-selective excitation pulse magnetic field F₃, on the other hand, the gate 23 is turned off so that no input is applied to the amplifier 25. The other gate 24 conducts the opposite operation, as shown in FIG. 10C. The amplifier 25 is the A- or AB-class highly linear amplifiers, whereas the amplifier 26 is the AB- or C-class highly efficient amplifier. The outputs of the amplifiers 25 and 26 are composed by a combiner 27 until they are inputted to the RF magnetic field generating coil 7.

What is claimed is:

1. An imaging method using nuclear magnetic resonance for producing images of an object by repeating several times the operations to excite the nuclear spins of the object and to detect resonance signals containing positional data, wherein each said exciting operation for resonance signals includes:
- a first step of exciting the nuclear spins of said object;
- a second step of rephasing said nuclear spins and detecting a first resonance signal while a field gradient is applied to produce a spin density distribution image;
- a third step of applying an RF magnetic field for inverting the direction of said nuclear spins to the direction opposite to that of an equilibrium state at an instant when said nuclear spins come into phase and after detection of said first resonance signal;
- a fourth step of again exciting nuclear spins after waiting a period of time for a relaxation of the magnetization of said nuclear spins which are directed to said opposite direction; and
- a fifth step of again rephasing said nuclear spins and detecting a second resonance signal while said field gradient is applied to produce a relaxation time enhanced image.

2. An imaging method using nuclear magnetic resonance, according to claim 1, wherein each said exciting operation for resonance signals further includes:
- a sixth step of applying an RF magnetic field for inverting the direction of said nuclear spins to the direction opposite to that of an equilibrium state at an instant when said nuclear spins come into phase and after said fifth step;
- a seventh step of again exciting said nuclear spins after waiting another period of time for another relaxation of magnetization of said nuclear spins which are directed to said opposite direction; and
- an eighth step of again rephasing said nuclear spins and detecting another resonance signal to produce another relaxation time enhanced image having a relaxation time effect different from that of said fifth step.

3. An imaging method using nuclear magnetic resonance, according to claim 1, wherein said second step includes application of a gradient field in a period during which the first resonance signal is detected and application of correcting gradient field pulses after the first resonance signal detection for cancelling the phase dispersion of said nuclear spins resulting from the application of the gradient field.

4. An imaging method using nuclear magnetic resonance, according to claim 1, wherein said third step includes application of non-selective excitation pulses to said object.

5. An imaging method using nuclear magnetic resonance, according to claim 1, wherein said third step includes application of selective excitation pulses combined with application of a predetermined gradient field to said object.

6. An imaging apparatus using nuclear magnetic resonance, comprising:
- means for generating a static field;
- means for generating gradient fields along three directions perpendicular to each other so as to produce field gradients along said three directions on said static field;
- means for generating an RF magnetic field for superposition on said static field;
- means for detecting the nuclear magnetic resonance signal from nuclear spins in an object to be imaged lying within said static field; and
- sequence control means for sequentially controlling said gradient fields generating means said RF magnetic field generating means, and said detecting means to generate a nuclear magnetic resonance signal plural times by excitation of the nuclear spins of said object and to rotate the direction of the nuclear spins of said object to the direction opposite to that of an equilibrium state and maintaining the opposite direction after the equilibrium state excitation of the nuclear magnetic resonance signals for the plural times so as to obtain a spin density distribution image and a relaxation time enhanced image.

7. An imaging apparatus using nuclear magnetic resonance, according to claim 6, wherein said RF magnetic field generating means includes: a first amplifier for amplifying selective excitation pulses to be used for exciting the nuclear spin for plural times; and a second amplifier for amplifying non-selective excitation pulses to be used for rotating said nuclear spin.

8. An imaging apparatus using nuclear magnetic resonance, according to claim 7, wherein said first and second amplifiers have their outputs composed by a power combiner and their respective inputs controlled by gate means.

* * * * *